(12) United States Patent
Cho et al.

(10) Patent No.: US 10,546,807 B2
(45) Date of Patent: Jan. 28, 2020

(54) CHIP ON FILE DISPLAY DEVICE INCLUDING THE SAME

(71) Applicant: LG Display Co., Ltd., Seoul (KR)

(72) Inventors: Soon-Dong Cho, Gumi-si (KR); Hoon Jang, Goyang-si (KR); Min-Gyu Park, Seoul (KR); Won-Yong Jang, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/198,228

(22) Filed: Nov. 21, 2018

(65) Prior Publication Data

US 2019/0164877 A1 May 30, 2019

(30) Foreign Application Priority Data

Nov. 30, 2017 (KR) ........................ 10-2017-0163390

(51) Int. Cl.
| | |
|---|---|
| *H01L 23/495* | (2006.01) |
| *H01L 23/498* | (2006.01) |
| *H01L 23/00* | (2006.01) |
| *H01L 27/12* | (2006.01) |
| *H01L 23/528* | (2006.01) |

(52) U.S. Cl.
CPC .... *H01L 23/49838* (2013.01); *H01L 23/4985* (2013.01); *H01L 23/49811* (2013.01); *H01L 23/528* (2013.01); *H01L 24/09* (2013.01); *H01L 27/124* (2013.01); *H01L 2224/09135* (2013.01)

(58) Field of Classification Search
CPC .......... H01L 23/4985; H01L 23/49827; H01L 23/49838; H01L 23/3107; H01L 23/5389; H01L 23/49833; H01L 23/49811; H01L 23/3114; H01L 23/5384
USPC ....................................... 257/668
See application file for complete search history.

(56) References Cited

U.S. PATENT DOCUMENTS

2016/0379906 A1* 12/2016 Kim .................. G09G 3/3688
 257/48
2017/0040345 A1* 2/2017 Jeong .................. H01L 27/124

* cited by examiner

*Primary Examiner* — Theresa T Doan
(74) *Attorney, Agent, or Firm* — Seed IP Law Group LLP

(57) ABSTRACT

Disclosed are a chip on film (COF) and a display device including the same, for reducing the number of input pads using a pattern branching structure. The COF is connected to gate-in-panel (GIP) output pads using a structure formed via branching of GIP wirings connected to the GIP input pads in a data driving integrated circuit (IC) or a circuit film to reduce the number of GIP input pads.

20 Claims, 5 Drawing Sheets

CHIP ON FILE DISPLAY DEVICE INCLUDING THE SAME

CROSS-REFERENCE TO RELATED APPLICATION(S)

This application claims the benefit of Korean Patent Application No. 10-20170163390, filed Nov. 30, 2017, which is hereby incorporated by reference as if fully set forth herein.

BACKGROUND

Technical Field

The present disclosure relates to a chip on film (COF) and a display device including the same, for reducing the number of input pads using a pattern branching structure.

Description of the Related Art

Recently, representative examples of a display device for displaying an image using digital data include a liquid crystal display (LCD) using liquid crystal, an organic light emitting diode (OLED) display using an OLED, and an electrophoretic display (EPD) using electrophoretic particles.

A gate-in-panel (GIP) type gate driver installed in a panel has been applied as a gate driver for driving gate lines of a panel. The GIP-type gate driver receives required GIP driving signals through GIP transmission lines of a chip on film (COF) with a data driving integrated circuit (IC) installed thereon from a printed circuit board (PCB).

The COF including the GIP transmission lines includes N GIP input pads, positioned at a left side of a circuit film, and N GIP input pads, positioned at a right side of the circuit film. During COF bonding, only the N GIP input pads, positioned at one side, are connected to a PCB and the N GIP input pads, positioned at the other side, are dummy pads that are not used.

However, when the number of GIP driving signals is increased, as in an OLED display device, the number of GIP input pads, formed in each COF, is also increased and, thus, there is a problem in that an input pad pitch of a COF is narrowed.

When the number of input pads of a COF is increased, misalignment error may occur during a bonding process between the COF and a PCB and, thus, a horizontal width of the COF is increased but there is a problem in that manufacturing costs are increased as a horizontal width of the COF is increased.

A method of additionally dividing each of two source PCBs into two pieces to overcome the misalignment error during the bonding process is proposed but the additionally divided source PCBs need to be connected to each other through a connector and a flexible cable and, thus, there is a problem in that the number of operations in a bonding and assembly process is increased, thus increasing tact time and manufacturing costs.

BRIEF SUMMARY

In various embodiments, the present disclosure provides a chip on film (COF) and a display device including the same, for reducing the number of input pads using a pattern branching structure.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a chip on film includes a circuit film with a driving integrated circuit (IC) installed thereon; IC input pads and N gate-in-panel (GIP) input pads arranged on a first pad region of the circuit film (N being a natural number equal to or greater than 2); IC output pads, a first group of N GIP output pads and a second group of N GIP output pads arranged in a second pad region of the circuit film; N GIP input lines arranged on the circuit film and connected between the GIP input pads and input terminals of a first edge portion of the driving IC; a first group of N GIP output lines connected between the first group of GIP output pads and output terminals of a second edge portion of the driving IC, a second group of N GIP output lines of a second group connected between the second group of GIP output pads and output terminals of a third edge portion of the driving IC the first and second groups of N GIP output lines being arranged on the circuit film; and wherein the N GIP input lines are connected to the first group of GIP output lines and connected to the second group of GIP output lines through the driving IC.

The driving IC may include N first connection lines that are separately connected to the GIP input lines, and N second connection lines that are separately connected between the first group of GIP output lines and the second group of GIP output lines, the first connection lines may be separately connected to the second connection lines, and the first connection lines may be formed at a different layer than the second connection lines and connected to the first connection lines through a contact hole.

The second connection lines may be separately connected between output terminals of the second edge portion of the driving IC and output terminals of the third edge portion facing the second edge portion.

The first group of GIP output pads may be arranged at one side of the second pad region, the second group of GIP output pads may be arranged at the other side, and the IC output pads may be arranged at a central portion between the one side and the other side.

The GIP input pads may be arranged at one side and a central portion of the first pad region or are separately arranged at opposite sides, and the GIP input lines connected to the GIP input pads may be connected to input terminals arranged at one side of the first edge portion of the driving IC, input terminals arranged at central portion of the first edge portion, or input terminals separately arranged at opposite sides of the first edge portion.

In another aspect of the present disclosure, a chip on film includes a circuit film with a driving integrated circuit (IC) installed thereon, N gate-in-panel (GIP) input pads and IC input pads arranged on a first pad region of the circuit film (N being a natural number equal to or greater than 2), a first group of N GIP output pads arranged in a second pad region of the circuit film and N GIP output pads and a second group of IC output pads, N GIP input lines arranged on the circuit film and connected to the GIP input pads, the first group of N GIP output lines connected to the first group of GIP output pads and the second group of N GIP output lines connected to the second group of GIP output pads, which are arranged on the circuit film, and N first connection lines provided on the circuit film at a first layer of the circuit film and connected to the GIP input lines, N second connection lines provided on the circuit film at a second layer different than the first layer and connected between the first group of GIP output lines and the second group of GIP output lines, wherein the first connection lines are separately connected to the second connection lines through a via hole.

In another aspect of the present disclosure, a display device is configured in such a way that a first COF connected to a first gate driver installed on the panel and a second COF connected to a second gate driver installed in the panel transmit a plurality of GIP driving signals using the aforementioned COF.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Figure 1:
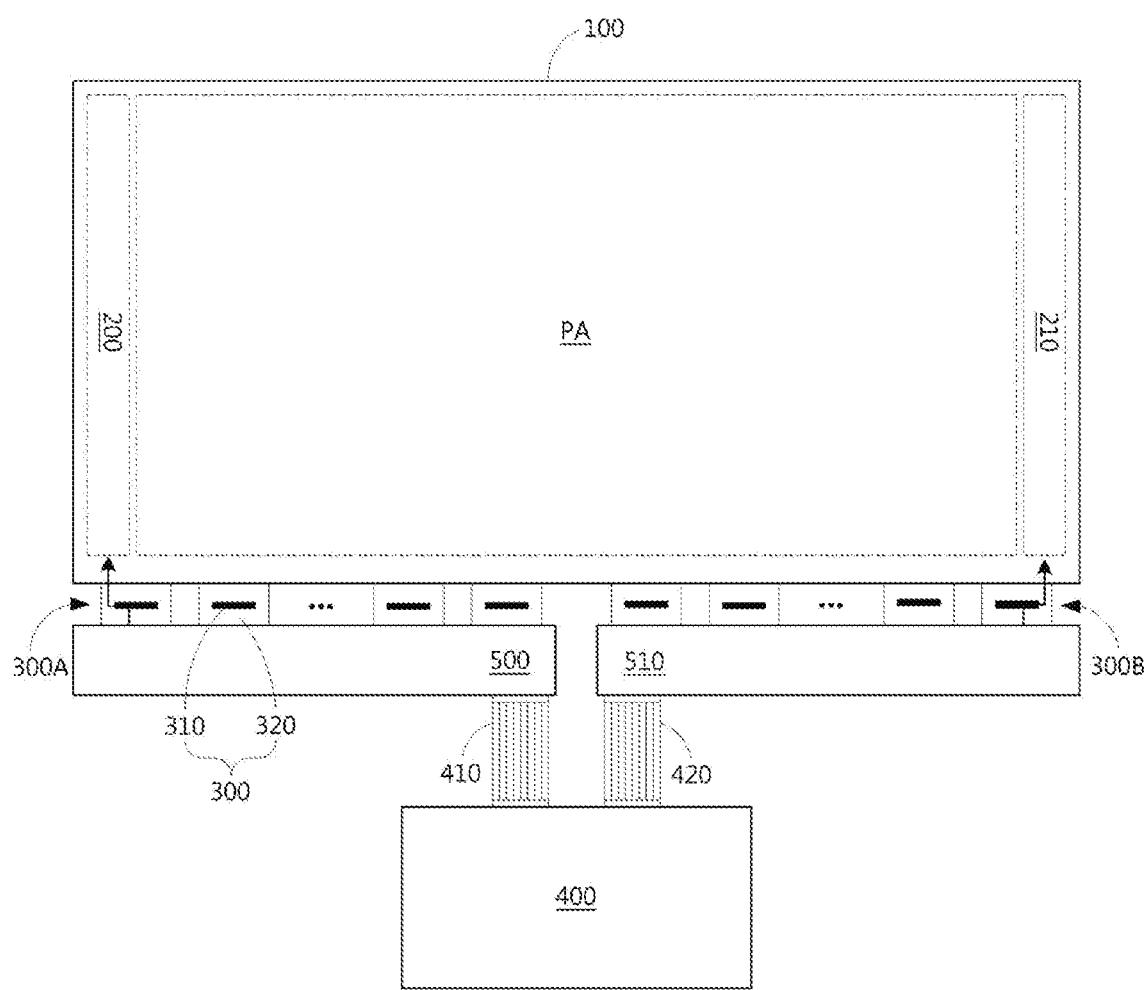
FIG. 1 is a schematic block diagram showing a configuration of a display device according to an embodiment of the present disclosure.

FIG. 1 is a schematic block diagram showing a configuration of a display device according to an embodiment of the present disclosure.

Referring to FIG. 1, the display device may include a panel 100, gate-in-panel (GIP)-type gate drivers 200 and 210, a data driver integrated circuit, source printed circuit boards (PCBs) 500 and 510, and so on.

The panel 100 may display an image through a pixel array PA in which subpixels are arranged in a matrix. A basic pixel may include at least three subpixels that are capable of representing white via color mixture of white W, red R, green G, and blue B subpixels. For example, the basic pixel may include subpixels of an R/G/B combination or subpixels of a W/R/G/B combination. The basic pixel may include subpixels of an R/G/B combination, subpixels of a W/R/G combination, subpixels of a B/W/R combination, and subpixels of a G/B/W combination.

The panel 100 may be various display panels such as a liquid crystal display (LCD) panel and an organic light emitting diode (OLED) panel and may be a touch panel with both a touch sensing function and a display function.

The panel 100 may include first and second GIP-type gate drivers 200 and 210 installed therein. The first and second gate drivers 200 and 210 may be positioned in first and second non-active regions of the panel 100, respectively, to drive gate lines included in the pixel array PA. The first and second gate drivers 200 and 210 may simultaneously supply gate signals at opposite ends of each gate line to reduce delay of the gate signals.

The data driver may include a plurality of chips on film (COFs) 300 in which a plurality of data driving integrated circuits (ICs) 310 are separately installed on a plurality of circuit films 320.

The plurality of COFs 300 may be connected between first and second source PCBs 500 and 510 and the panel 100. A first pad region of each of the plurality of COFs 300 may include a plurality of input pads that are bonded and connected to pad regions of the first and second source PCBs 500 and 510 through an anisotropic conductive film (ACF) using tape automated bonding (TAB). A second pad region of each of the plurality of COFs 300 may include a plurality of output pads that are bonded and connected to pad regions of the panel 100 through an ACF using a TAB method.

The first and second source PCBs 500 and 510 may be connected to a control PCB 400 through first and second flat flexible cables (FFCs) 410 and 420. The control PCB 400 may have installed therein a timing controller for generating a plurality of data control signals and outputting the data control signal with image data, a level shifter for generating and outputting a plurality of GIP driving signals under control of the timing controller, and driving circuits such as a power management circuit for generating and outputting a plurality of driving voltages required by a display device.

The plurality of data driving ICs 310 may receive a plurality of data control signals and image data from the control PCB 400 through the FFCs 410 and 420 and the source PCBs 500 and 510, convert the received image data into an analog data signal, and supply the analog data signal to data lines of the panel 100.

When the panel 100 is an organic light emitting diode (OLED) panel, the plurality of data driving ICs 310 may include a sensing unit for sensing pixel current indicating electrical properties (a threshold voltage and mobility of a driving TFT and a threshold voltage of an OLED device) of each subpixel as current or voltage under control of the timing controller, converting the pixel current into digital sensing data, and supplying the digital sensing data to the timing controller. The timing controller may update a compensation value of each subpixel using the sensing data of each subpixel, received from the plurality of data driving ICs 310. The timing controller may compensate for image data corresponding to each subpixel with a corresponding compensation value to compensate for brightness non-uniformity due to a property difference between subpixels.

GIP driving signals generated from the level shifter of the control PCB 400 may be transmitted to a first COF 300 through the first FFC 410 and the first source PCB 500 and may be transmitted to a last COF 300 through the second FFC 420 and the second source PCB 510.

For example, the GIP driving signals may include a plurality of scan clocks that are used as a start pulse, a reset pulse, an alternating current (AC) driving voltage for an odd frame, an AC driving voltage for an even frame, and a scan signal for driving gate lines and may further include a plurality of carry clocks for control of a shift operation of the gate drivers 200 and 210. When the panel 100 is an OLED panel, the GIP driving signals may further include a plurality of sense clocks used as a sense signal for driving sensing gate lines.

The first and last COFs 300 each may further include a GIP transmission path. The first and last COFs 300 transmit a plurality of GIP driving signals supplied from the source PCBs 500 and 510 to the first and second gate drivers 200 and 210 of the panel 100 through the GIP transmission path.

In particular, the first and last COFs 300 each according to an embodiment of the present disclosure may be connected to 2N GIP output pads using a structure formed via branching of N GIP wirings connected to the N GIP input pads into a number 2N of transmission paths a data driving IC or a circuit film. Accordingly, the number of GIP input pads may be reduced to N from 2N corresponding to the related art, that is, ½ of the case of the related art. The number N, as used herein, refers to a non-zero natural number. Unless otherwise indicated herein, the number N is an integer equal to or greater than two.

Figure 2:
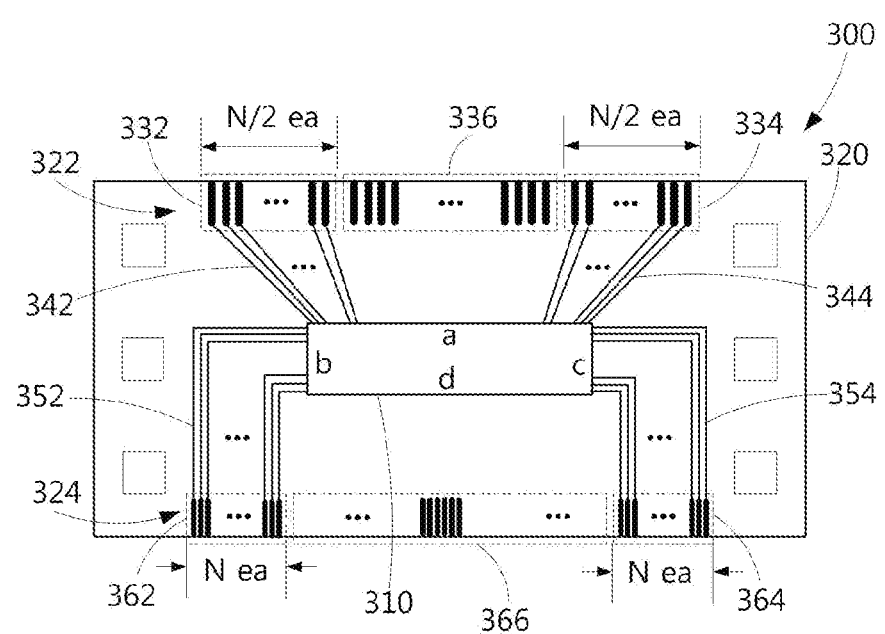
FIG. 2 is a diagram showing a COF structure in terms of a gate-in-panel (GIP) transmission path according to a first embodiment of the present disclosure.
Figure 3:
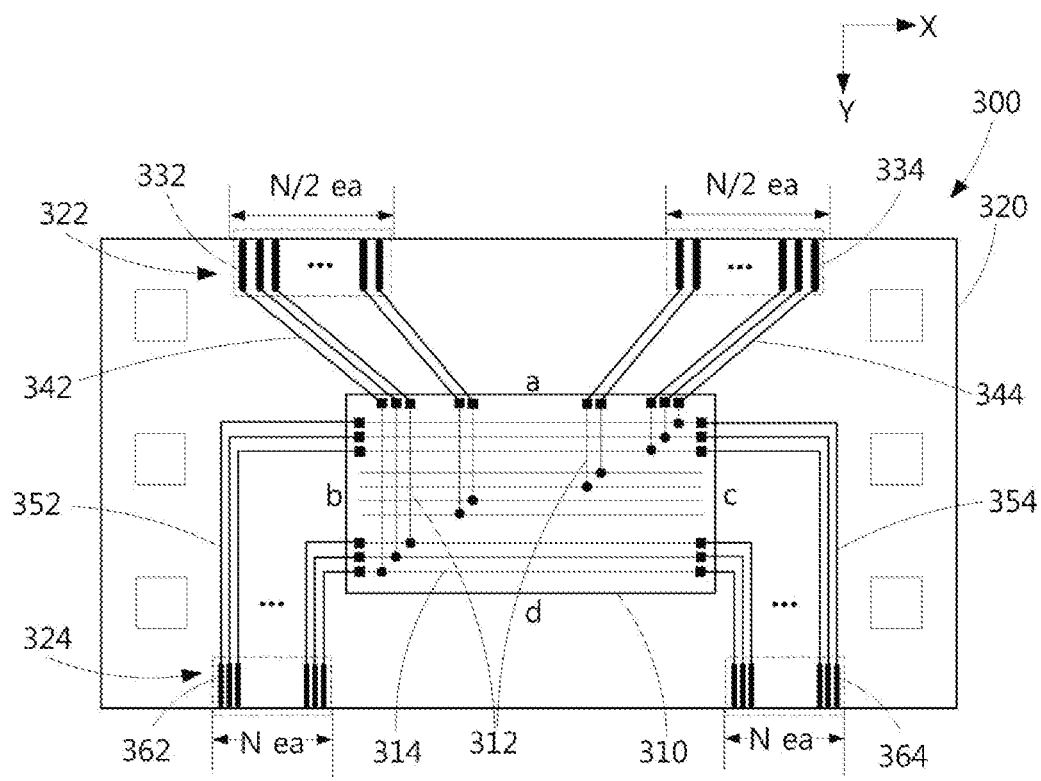
FIG. 3 is an enlarged view of a GIP transmission path, positioned in the COF illustrated in FIG. 2.

FIG. 2 is a diagram showing a COF structure in terms of a GIP transmission path according to a first embodiment of the present disclosure. FIG. 3 is an enlarged view of a GIP transmission path, positioned in the COF illustrated in FIG. 2.

Referring to FIGS. 2 and 3, a COF 300 including a GIP transmission path according to an embodiment of the present disclosure may include N GIP input pads 332 and 334, arranged in a first pad region 322 of the circuit films 320, and 2N GIP output pads 362 and 364, arranged in a second pad region 324 of the circuit films 320. The 2N GIP output pads are divided into a first group 362 of GIP output pads and a second group 364 of GIP output pads. A sum of the number of GIP output pads 362 and the number of GIP output pads 364 is equal to 2N. In at least some embodiments, the number of GIP output pads 362 is equal to the number of GIP output pads 364. The COF 300 further may include N GIP input lines 342 and 344, positioned on the circuit films 320 and connected between the N GIP input pads 332 and 334 and the data driving IC 310, and 2N GIP output lines 352 and 354, positioned on the circuit films 320 and connected between the data driving IC 310 and the 2N GIP output pads 362 and 364. Each of the GIP output lines 352 is connected to a corresponding one of the GIP output pads 362, and each of the GIP output lines 354 is connected to a corresponding one of the GIP output pads 364.

The data driving IC 310 may include first to fourth edge portions a, b, c, and d. Terminals connected to the first pad region 322 may be positioned at a first edge portion a of the data driving IC 310 and terminals connected to the second pad region 324 may be positioned at the second to fourth edge portions b, c, and d. The first and fourth edge portions a and d of the data driving IC 310 may be positioned on opposite sides of the data driving IC 310 and the second and third edge portions b and c may be positioned on opposite sides of the data driving IC 310 different than the first and fourth edge portions a and d.

The first pad region 322 of the circuit films 320 may be connected to corresponding pad regions of the source PCB 500 or 510. The first pad region 322 of the circuit films 320 may include a collective number N of GIP input pads 332 and 334 and IC input pads 336. The collective number N of GIP input pads 332 and 334 may include a first group 332 and a second group 334, each of which has an equal number N/2 of GIP input pads, and the IC input pads 336 may be arranged between the first and second groups 332 and 334.

The first group of N/2 GIP input pads 332 may be arranged at one side of the first pad region 322 and the second group of N/2 input pads 334 may be arranged at the other side. IC output pads (not shown) connected to the source PCB 500 or 510 may be further arranged on the first pad region 322.

The data driving IC 310 may be connected to the IC input pads 336 via a set of IC data input lines (not shown) connected between the IC input pads 336 and data input terminals of the data driving IC 310. At least some of the data input terminals of the data driving IC 310 may be provided on the first edge portion a of the data driving IC 310. The data driving IC 310 may also be connected to the IC output pads 366 via a set of IC data output lines (not shown) connected between the IC output pads 366 and data output terminals of the data driving IC 310. At least some of the data output terminals of the data driving IC 310 may be provided on the fourth edge portion d of the data driving IC 310. The data control signals and image data from the control PCB 400 may be received at the IC input pads 336 and provided to the data input terminals of the data driving IC 310 via the IC data input lines. The data driving IC 310 may process or convert the received data (e.g., data control signals, image data) into an analog data signal, which is then output from the data output terminals of the data driving IC 310. The analog data signal travels through the IC data output lines and to the IC output pads 366 from which the analog data signal may be provided to data lines of the pixel array PA. The data received at the IC input pads 336 and converted by the data driving IC 310 is independent of the GIP driving signals received at the GIP input pads 332 and 334. The analog signal provided at the IC output pads 366 is also independent of the GIP driving signals provided at the GIP output pads 362 and 364.

The number N of GIP input lines 342 and 344, positioned in the circuit films 320, may be divided into the first group 342 and the second group 344 of GIP input lines, each of which has an equal number N/2 of GIP input lines. The first group of GIP input lines 342 may be separately connected to the first group of GIP input pads 332 and may be separately connected to input terminals positioned at one side of the first edge portion a of the data driving IC 310. The second group of GIP input lines 344 may be separately connected to the second group of GIP input pads 334 and may be separately connected to input terminals positioned at the other end of the first edge portion a of the data driving IC 310.

The second pad region 324 of the circuit films 320 may be connected to the pad region of the panel 100. In some instances, with regard to the 2N GIP output pads 362 and 364, one of the first group 362 and the second 364 may be electrically coupled to a corresponding GIP pad region of the panel 100, and the other group of the first group 362 and the second group 364 may be a dummy pad that is not electrically coupled to a corresponding GIP pad region of the panel 100. The first group of N GIP output pads 362 may be arranged at one side of the second pad region 324, the second group of N GIP output pads 364 may be arranged at the other side of the second pad region 324, and IC output pads 366 may be arranged between the first and second groups 362 and 364. The IC output pads 366 may be connected to output terminals of the fourth edge portion d of the data driving IC 310 through wirings. For instance, with reference to FIG. 1, a first COF 300A connected at a first connection position of the pixel array PA may have the first group of N GIP output pads 362 connected to an input connection for the GIP gate driver 200 whereas the second group of N GIP output pads 364 are dummy pads that are unconnected to an input connection for the GIP gate driver 200. A second COF 300B connected at a last connection position of the pixel array PA may have the second group of N GIP output pads 364 connected to an input connection for the GIP gate driver 210 whereas the first group of N GIP output pads 362 are dummy pads that are unconnected to an input connection for the GIP gate driver 210. The plurality of COFs 300 may be consecutively connected at connection positions of the panel 100, with the first COF 300A being positioned at a first connection position closest to a connection of the GIP gate driver 200 and the second COF 300B being positioned at a last connection position closest to a connection of the GIP gate driver 210.

The collective number 2N of GIP output lines 352 and 354, positioned on the circuit film 320, may include a first group 352 and a second group 354, each of which has an equal number N of output lines. The second group of the GIP output lines 352 may be separately connected to corresponding output terminals of the second edge portion b of the data driving ICs 310 and may be separately connected to corresponding ones of N GIP output pads 362. The second group of GIP output lines 354 may be separately connected to corresponding output terminals of the third edge portion c of the data driving ICs 310 and may be separately connected to corresponding ones of the second group of N GIP output pads 364.

The N GIP input lines 342 and 344 may be respectively connected to the first group of N GIP output lines 352 and to the second group of N GIP output lines 354 through the data driving IC 310. Accordingly, the N GIP input pads 332 and 334 may be connected to the 2N GIP output pads 362 and 364 through the data driving IC 310.

Referring to FIG. 3, the N GIP input lines 342 and 344 may be separately connected to N first connection lines 312 formed in the data driving IC 310 through terminals of the first edge portion a of the data driving IC 310. The N first connection lines 312 may be separately connected to N second connection lines 314 in the data driving IC 310. The N second connection lines 314 and the N first connection lines 312 may overlap each other from a plan view perspective with an insulating layer formed between the first connection lines 312 and the second connection lines 314. The N second connection lines 314 may be connected to the N first connection lines 312, respectively, through a contact hole extending through the insulating layer. The first connection lines 312 may extend in the Y-axis direction and the second connection lines 314 may extend in the X-axis direction, which is transverse to the Y-axis direction.

First ends of the N second connection lines 314 may be separately connected to the first group of N GIP output lines 352 through terminals of the second edge portion b of the data driving IC 310 and, thus, may be connected to the first group of GIP output pads 362. Second ends of the N second connection lines 314 may be separately connected to the second group of N GIP output lines 354 through terminals of the third edge portion c of the data driving IC 310 and, thus, may be connected to the second group of GIP output pads 364.

In other words, the first group of N GIP input lines 342 may be separately connected to the second group of N GIP output lines 354 through the second connection lines 314 that extend in the X-axis direction in the data driving IC 310. The first group of N GIP output lines 352 and the second group of N GIP output lines 354 may be connected to the first connection lines 312 in the data driving IC 310 through the second connection lines 314 in the data driving IC 310.

The first group of N GIP output lines 352 may include a Y-axis direction extension portion connected to the first group of N GIP output pads 362 and an X-axis direction extension portion connected between the Y-axis direction extension portion and output terminals of the second edge portion b of the data driving IC 310. The second group of GIP output line 354 may include a Y-axis direction extension portion connected to the second group of GIP output pad 364 and an X-axis direction extension portion connected between the Y-axis direction extension portion and output terminals of the third edge portion c of the data driving IC 310.

As such, the COF 300 may use the second connection lines 314 that are connected to the first connection lines 312 in the data driving IC 310 via a branching structure to connect N GIP input pads to 2N GIP output pads. Accordingly, the number of GIP input pads may be reduced from the number 2N to the number N, which is half the number of GIP input pads than in at least some chip on film architectures. Moreover, in the COF 300, the GIP signal transmission path is independent of the data signal path for control signals and image data.

Figure 4:
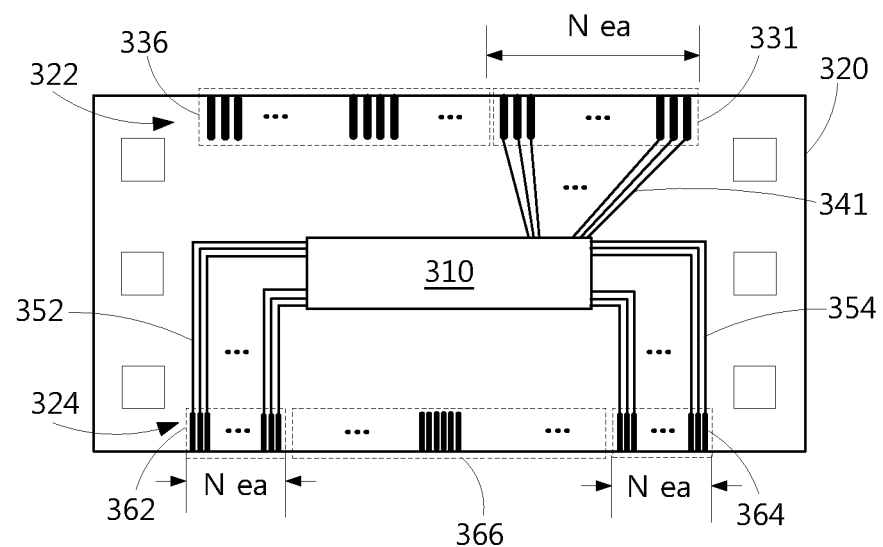
FIG. 4 is a diagram showing a COF structure in terms of a GIP transmission path according to a second embodiment of the present disclosure.
Figure 5:
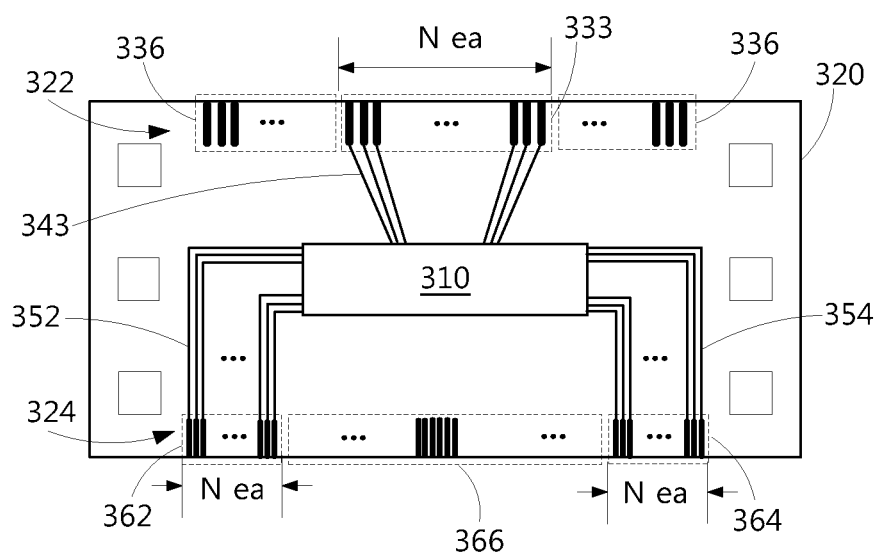
FIG. 5 is a diagram showing a COF structure in terms of a GIP transmission path according to a third embodiment of the present disclosure.

FIGS. 4 and 5 are diagrams showing a COF structure in terms of a GIP transmission path according to second and third embodiments of the present disclosure.

Referring to FIG. 4, in the first pad region 322 of the circuit film 320, a number N of GIP input pads 331 may be arranged at one side and IC input pads 336 may be arranged at the other side of the first pad region 322. A number N of GIP input lines 341, connected to the N GIP input pads 331, may be connected to input terminals positioned at one side of the first edge portion a of the data driving IC 310. The other components are the same as in the above description of FIGS. 2 and 3.

Referring to FIG. 5, in the first pad region 322 of the circuit film 320, the N GIP input pads 333 may be arranged at a central portion and the IC input pads 336 may be separately arranged at opposite sides of the first pad region 322 of the circuit film 320. The N GIP input lines 343 connected to the N GIP input pads 333 may be connected to input terminals positioned at a central portion of the first edge portion a of the data driving IC 310. The other components are the same as in the above description of FIGS. 2 and 3.

Figure 6:
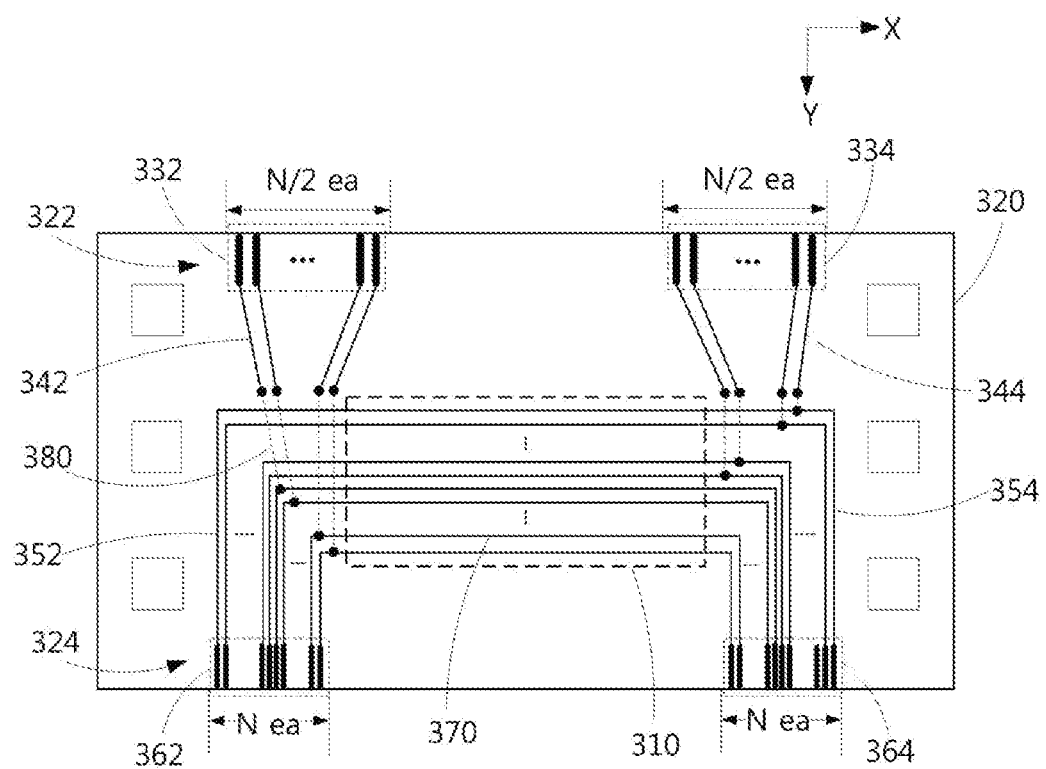
FIG. 6 is a diagram showing a COF structure in terms of a GIP transmission path according to a fourth embodiment of the present disclosure.

FIG. 6 is a diagram showing a COF structure in terms of a GIP transmission path according to a fourth embodiment of the present disclosure.

Compared with the COF shown in FIG. 3, the COF shown in FIG. 6 may be configured in such a way that all wirings for GIP signal transmission to a GIP driver are arranged on the circuit film 320 to independently transmit GIP driving signals without connection with or transmission through the data driving IC 310. First connection lines 380 and second connection lines 370 may be arranged at different layers in a circuit film 320 and may be connected to each other through a via hole. The via hole may be formed, for example, in an insulating layer or a dielectric layer formed between a first layer and a second layer in the circuit film 320 on which the first connection lines 370 and the second connection lines 380 are respectively located.

For example, the second connection lines 370 connected between the N output lines 352 for a GIP of the first group and the N output lines 354 for a GIP of the second group may be formed on the same layer as the output lines 352 and 354 for a GIP and the GIP input lines 342 and 344 may also be formed on a same first layer. The first connection lines 380 connected to the GIP input lines 342 and 344 may be formed on a second layer different than the first layer to cross the second connection lines 370. The first connection lines 380 may be connected to the GIP input lines 342 and 344 and the second connection lines 370 through via holes.

The second connection lines 370 may overlap with an installation region of the circuit film 320 at which the data driving IC 310 is installed. On the other hand, the first connection lines 380 may not overlap with the installation region of the circuit film 320, may overlap the second connection lines 370, and may be separately connected to the second connection lines 370 through via holes.

The first group of N GIP output lines 352 may include a Y-axis direction extension portion connected to the first group of GIP output pads 362 and an X-axis direction extension portion connected between the Y-axis direction extension portion and one end of the second connection lines 370. The second group of GIP output lines 354 may include a Y-axis direction extension portion connected to the second group of GIP output pads 364 and an X-axis direction extension portion connected between the Y-axis direction extension portion and the other end of the second connection lines 370.

The N GIP input lines 342 and 344 may be connected to the first group of N GIP output lines 352 and may also be connected to the second group of N GIP output lines 354 via a branching structure of the first connection lines 380 and the second connection lines 370 formed on the circuit film 320. Accordingly, the N GIP input pads 332 and 334 may be connected to the 2N GIP output pads 362 and 364 and, thus, the number of GIP input pads may be reduced from 2N to N, which is half the number of GIP input pads than in at least some chip on film architectures.

The COF structure according to the above embodiments described with reference to FIGS. 2 to 6 may be applied in the same way to a PCB structure corresponding to the COF or a COF of a display device with a gate driving IC applied thereto.

A COF according to an embodiment may be connected to 2N GIP output pads using a structure formed via branching of N GIP wirings connected to the N GIP input pads into a number 2N of transmission paths in a driving IC or a circuit film. Accordingly, the number of GIP input pads may be reduced from 2N to N, which is half the number of GIP input pads than in at least some chip on film architectures.

Accordingly, even if a horizontal width of a COF is not increased, a pitch of an input pad may be stably ensured and, thus, misalignment error during the bonding process of a COF and a PCB may be minimized and manufacturing costs may be reduced.

According to the structures described herein, it is not required to divide each of two source PCBs into a plurality of pieces to overcome misalignment error of a COF and a source PCB. Thus, bonding and assembly processes are easily performed, thereby reducing the time and cost of manufacturing.

A COF according to an embodiment of the present disclosure may be applied to any display device such as an OLED display device and an LCD.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

References to "group," as used herein, refers to a non-zero collection of members.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A chip on film, comprising:
   a circuit film with a driving integrated circuit (IC) installed thereon, the circuit film having a first pad region and a second pad region;
   a number N of gate-in-panel (GIP) input pads arranged on the first pad region wherein N is a natural number equal to or greater than 2;
   a first group of N GIP output pads arranged on the second pad region;
   a second group of N GIP output pads arranged on the second pad region;
   a number N of GIP input lines arranged on the circuit film and connected between the GIP input pads and input terminals of a first edge portion of the driving IC;
   a first group of N GIP output lines arranged on the circuit film and connected between the first group of N GIP output pads and output terminals of a second edge portion of the driving IC; and
   a second group of N GIP output lines arranged on the circuit film and connected between the second group of N GIP output pads and output terminals of a third edge portion of the driving IC,
   wherein the N GIP input lines are connected to the first group of N GIP output lines and connected to the second group of N GIP output lines through the driving IC.

2. The chip on film of claim 1, wherein the driving IC includes:
   a number N of first connection lines that are separately connected to the GIP input lines, the first connection lines disposed on a first layer, and
   a number N of second connection lines that are separately connected between the first group of N GIP output lines and the second group of N GIP output lines, the second connection lines being disposed on a second layer different than the first layer, and wherein the first connection lines are separately connected to the second connection lines through one or more contacts extending between the first layer and the second layer.

3. The chip on film of claim 2, wherein the second connection lines are separately connected between output terminals of the second edge portion of the driving IC and output terminals of the third edge portion.

4. The chip on film of claim 3, further comprising:
a plurality of IC output pads arranged on the second pad region, wherein the first group of N GIP output pads are arranged at a first portion of the second pad region, the second group of N GIP output pads are arranged at a second portion of the second pad region, and the IC output pads are arranged at a central portion between the first portion and the second portion.

5. The chip on film of claim 2, further comprising:
an insulating layer formed between the first layer and the second layer, wherein the one or more contacts extend through the insulating layer electrically coupling the first connection lines with the second connection lines.

6. The chip on film of claim 1, wherein the GIP input pads are arranged along one side of the first pad region, at a central portion of the first pad region, or along two opposite sides of the first pad region, and
wherein the GIP input lines are connected to input terminals arranged along the first edge portion of the driving IC at locations corresponding to an arrangement of the GIP input pads along the one side, at the central portion, or along the two opposite sides of the first pad region.

7. The chip on film of claim 1, further comprising:
a data transmission path between the first pad region and the second pad region, the data transmission path including a first data path from the first pad region to the driving IC, a second data path through the driving IC, and a third data path from the driving IC to the second pad region,
wherein the number N of GIP input lines, the first group of N output lines, and the second group of N output lines comprise a GIP transmission path, the GIP transmission path being independent of the data transmission path and including a path through the driving IC.

8. The chip on film of claim 1, further comprising:
a plurality of IC output pads arranged on the second pad region; and
a plurality of IC input pads arranged on the first pad region, wherein the driving IC processes input data signals received at the plurality of IC input pads, and provides output data signals to the plurality of IC output pads based on the input data signals.

9. A chip on film, comprising:
a circuit film with a driving integrated circuit (IC) installed thereon, the circuit film having a first pad region and a second pad region;
a number N of gate-in-panel (GIP) input pads arranged on the first pad region, wherein N is a natural number equal to or greater than 2;
a first group of N GIP output pads arranged on the second pad region;
a second group of N GIP output pads arranged on the second pad region;
a number N of GIP input lines arranged on the circuit film and connected to the GIP input pads;
a first group of N GIP output lines arranged on the circuit film and connected to the first group of N GIP output pads;
a second group of N GIP output lines arranged on the circuit film and connected to the second group of N GIP output pads;
a number N of first connection lines arranged at a first layer of the circuit film and connected to the GIP input lines; and
a number N of second connection lines arranged at a second layer of the circuit film different from the first layer, the second connection lines connected between the GIP output lines and the GIP output lines,
wherein the first connection lines are separately connected to the second connection lines through a via hole.

10. The chip on film of claim 9, wherein the first connection lines do not overlap with an installation region of the circuit film for installing the driving IC; and
wherein the second connection lines overlap with the installation region of the circuit film.

11. The chip on film of claim 9, further comprising:
a data transmission path between the first pad region and the second pad region, the data transmission path being from the first pad region, through the driving IC, and to the second pad region,
wherein the number N of GIP input lines, the first group of N output lines, and the second group of N output lines comprise a GIP transmission path that is independent of the data transmission path and that travels at least partially through the driving IC.

12. A display device, comprising:
a panel comprising a pixel array;
first and second gate drivers installed at opposite sides of the panel to drive gate lines of the pixel array; and
a plurality of chips on film on which a plurality of data driving integrated circuits (ICs) for driving data lines of the pixel array are installed on a plurality of circuit films, respectively, and which are connected between the panel and one or more printed circuit boards (PCBs),
wherein a first chip on film of the plurality of chips on film is connected to the first gate driver, a second chip on film of the plurality of chips on film is connected to the second gate driver, and the first chip on film and the second chip on film each transmit a plurality of gate-in-panel (GIP) driving signals,
wherein the first chip on film and the second chip on film each include:
a circuit film with a data driving IC of the plurality of data driving ICs installed thereon, the circuit film having a first pad region and a second pad region;
a number N of GIP input pads arranged on the first pad region, wherein N is a natural number equal to or greater than 2;
a first group of N GIP output pads arranged on the second pad region;
a second group of N GIP output pads arranged on the second pad region; a number N of GIP input lines arranged on the circuit film and connected between the GIP input pads and input terminals of a first edge portion of the data driving IC;
a first group of N GIP output lines arranged on the circuit film and connected between the first group of N GIP output pads and output terminals of a second edge portion of the data driving IC; and
a second group of N GIP output lines arranged on the circuit film and connected between the second group of N GIP output pads and output terminals of a third edge portion of the data driving IC, wherein the N GIP input lines are each respectively connected to a first GIP output line of N GIP output lines and connected to a second GIP output line of N GIP output lines through the data driving IC.

13. The display device of claim 12, wherein the data driving IC includes:
 a number N of first connection lines disposed on a first layer and that are separately connected to the GIP input lines, and
 a number N of second connection lines disposed on a second layer different than the first layer and that are separately connected between the first group of N GIP output lines and the second group of N GIP output lines,
 wherein the first connection lines are separately connected to the second connection lines through a contact hole extending between the first layer and the second layer.

14. The display device of claim 13, wherein the second connection lines are separately connected between the output terminals of the second edge portion of the data driving IC and the output terminals of the third edge portion that is opposite to the second edge portion.

15. The display device of claim 12, wherein the plurality of chips on film are consecutively connected to the pixel array, wherein the first chip on film is connected to a first connection position of the pixel array and the second chip on film is connected to a last connection position of the pixel array.

16. The display device of claim 14, further comprising:
 a plurality of IC output pads arranged on the second pad region, wherein the first group of N GIP output pads are arranged at a first portion of the second pad region, the second group of N GIP output pads are arranged at a second portion of the second pad region, and the IC output pads are arranged at a central portion between the first portion and the second portion.

17. The display device of claim 13, wherein the GIP input pads are arranged along one side of the first pad region, at a central portion of the first pad region, or along two opposite sides of the first pad region, and
 wherein the GIP input lines are connected to input terminals arranged at along the first edge portion of the data driving IC at locations corresponding to an arrangement of the GIP input pads at the one side, the central portion, or the two opposite sides of the first pad region.

18. The display device of claim 12, wherein the first and second chips on film are connected to the one or more PCBs through the respective first pad regions of the circuit films of the first and second chips on film, and are each connected to the panel through the respective second pad regions of the circuit films of the first and second chips on film, and
 wherein the first group of N GIP output pads of the first and second chips on film are connected to the panel and the second group of N GIP output pads of at least one of the first and second chips on film is unconnected to the panel.

19. A display device, comprising:
 a panel comprising a pixel array;
 first and second gate drivers installed at opposite sides of the panel to drive gate lines of the pixel array; and
 a plurality of chips on film on which a plurality of data driving integrated circuits (ICs) for driving data lines of the pixel array are installed on a plurality of circuit films, respectively, and which are connected between the panel and one or more printed circuit boards (PCBs),
 wherein a first chip on film of the plurality of chips on film is connected to the first gate driver, a second chip on film of the plurality of chips on film is connected to the second gate driver, and the first chip on film and the second chip on film each transmit a plurality of gate-in-panel (GIP) driving signals,
 wherein the first chip on film and the second chip on film each include:
  a circuit film with a data driving IC of the plurality of data driving ICs installed thereon, the circuit film having a first pad region and a second pad region;
  a number N of GIP input pads arranged on the first pad region, wherein N is a natural number equal to or greater than 2;
  a first group of N GIP output pads arranged on a second pad region of the circuit film;
  a second group of N GIP output pads arranged on the second pad region; a number N of GIP input lines arranged on the circuit film and connected to the GIP input pads;
  a first group of N GIP output lines arranged on the circuit film and connected to the first group of N GIP output pads;
  a second group of N GIP output lines arranged on the circuit film and connected to the second group of N GIP output pads;
  a number N of first connection lines arranged on a first layer of the circuit film and connected to the N GIP input lines; and
  a number N of second connection lines arranged at a second layer of the circuit film and connected between the first group of N GIP output lines and the second group of N GIP output lines,
  wherein the first connection lines are separately connected to the second connection lines through a via hole.

20. The display device of claim 19, wherein the first and second chips on film are connected to the one or more PCBs through the respective first pad regions of the circuit films of the first and second chips on film, and are each connected to the panel through the respective second pad regions of the circuit films of the first and second chips on film, and
 wherein the first group of N GIP output pads of the first and second chips on film are connected to the panel and the second group of N GIP output pads of at least one of the first and second chips on film is unconnected to the panel.

* * * * *